(12) United States Patent
Cho et al.

(10) Patent No.: US 8,164,185 B2
(45) Date of Patent: Apr. 24, 2012

(54) SEMICONDUCTOR DEVICE, RETICLE USED IN FABRICATING METHOD FOR THE SAME AND FABRICATION METHOD THEREOF

(75) Inventors: Young-woo Cho, Suwon-si (KR); Sang-hoon Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 933 days.

(21) Appl. No.: 11/703,245

(22) Filed: Feb. 7, 2007

(65) Prior Publication Data
US 2007/0182005 A1 Aug. 9, 2007

(30) Foreign Application Priority Data
Feb. 8, 2006 (KR) .................... 10-2006-0012279

(51) Int. Cl.
*H01L 23/48* (2006.01)
(52) U.S. Cl. ........ 257/734; 257/786; 257/781; 257/784; 257/775; 257/776; 257/E23.02; 257/E23.134; 438/612; 438/669; 438/671; 438/618
(58) Field of Classification Search .................. 257/734, 257/786, 781, 784, 775, 776 E23.02 E23.134; 438/612, 669, 671, 618
See application file for complete search history.

(56) References Cited

U.S. PATENT DOCUMENTS
5,565,385 A 10/1996 Rostoker et al.
6,713,381 B2 * 3/2004 Barr et al. ............. 438/622
2004/0032279 A1 * 2/2004 Ishio et al. ............ 324/765
2005/0173800 A1 * 8/2005 Pogge et al. ........... 257/758
2005/0263894 A1 12/2005 Huber et al.

FOREIGN PATENT DOCUMENTS
| JP | 2004-079774 | | 3/2004 |
| JP | 2005-043793 | | 2/2005 |
| JP | 2005043793 A | * | 2/2005 |
| KR | 100210711 | | 4/1999 |
| KR | 10-2005-0033473 | | 4/2005 |

OTHER PUBLICATIONS

Office Action for corresponding Korean Application dated May 17, 2007.
Korean Notice of Examination Report dated Dec. 8, 2006.

* cited by examiner

*Primary Examiner* — Junghwa M Im
(74) *Attorney, Agent, or Firm* — Harness, Dickey & Pierce, P.L.C.

(57) ABSTRACT

A semiconductor device may include a substrate and a dielectric layer may be formed on the substrate. A multi-layered interconnection structure may be embedded in the dielectric layer. A plurality of bonding pads, which may be connected to an uppermost interconnection layer of the multi-layered interconnection structure, may be spaced apart in a first direction. A passivation layer may have a plurality of bonding pad openings that may be defined by a plurality of slits and respectively expose the bonding pads. The slits may overlap isolations of the bonding pads. Each of the slits may have an edge width that may be larger than a center width thereof.

18 Claims, 6 Drawing Sheets

SEMICONDUCTOR DEVICE, RETICLE USED IN FABRICATING METHOD FOR THE SAME AND FABRICATION METHOD THEREOF

PRIORITY STATEMENT

This application claims priority from Korean Patent Application No. 10-2006-0012279 filed on Feb. 8, 2006, in the Korean Intellectual Property Office, the entire contents of which are incorporated herein by reference.

BACKGROUND

1. Field

Example embodiments relate to a semiconductor device, and more particularly, to a semiconductor device, a reticle that may be used in the fabrication of the semiconductor device, and a method of fabricating the semiconductor device.

2. Description of the Related Art

In semiconductor devices, a pitch between bonding pads may be decreased. As the pitch between bonding pads is decreased, a pitch between pad openings that may expose bonding pads may be reduced.

Referring to FIG. 1, as the pitch between bonding pad openings 12 that are formed in a passivation layer 10 to expose the underlying bonding pads (not shown) is decreased, the width of passivation layer slits "s" existing between the bonding pad openings 12 may be decreased. To obtain minimum bonding margins for wire bonding, restrictions may be imposed on the degree to which the size of the bonding pad openings 12 may be reduced according to the pitch between the bonding pad openings 12. Accordingly, the size of the bonding pad openings 12 may not be reduced proportional to the reduction of the pitch between the bonding pad openings 12. Thus, if the pitch between the bonding pad openings 12 is decreased, then the width of the passivation layer slits "s" may be decreased. For example, if the pitch of the bonding pad openings 12 is 60 μm, then the width of the passivation layer slits "s" may be about 24 μm. However, when attempts are made to reduce the pitch of the bonding pad openings 12 (e.g., a pitch of 35 μm), then the width of the passivation layer slits "s" may be reduced (e.g., the width may become as small as about 8 μm) and result in defects. For example, the passivation layer slits "s" having a reduced width may be inadvertently lifted from the surface of the device. The lifted passivation layer slits "s'" may cause bonding defects in a subsequent wire-bonding process.

SUMMARY

According to example embodiments, a semiconductor device may include a substrate. A dielectric layer may be formed on the substrate. A multi-layered interconnection structure may be embedded in the dielectric layer. A plurality of bonding pads may be connected to an uppermost interconnection layer of the multi-layered interconnection structure. The bonding pads may be spaced apart in a first direction. A passivation layer may have a plurality of bonding pad openings. The bonding pad openings may be defined by a plurality of slits and respectively expose the bonding pads. The slits may overlap isolations of the bonding pads, and an edge width of the slits may be larger than a center width of the slits.

According to example embodiments, a reticle may be formed on a transparent substrate through which exposure light is transmittable. The reticle may include a light shield layer with a plurality of light transmitters that are spaced apart in a first direction. The light transmitters may be rectangles with chamfered or rounded corners.

According to example embodiments, a method may involve providing a substrate. A dielectric layer, in which a multi-layered interconnection structure may be embedded, may be formed on the substrate. A plurality of bonding pads may be connected to an uppermost interconnection layer of the multi-layered interconnection structure. The bonding pads may be spaced apart in a first direction. A passivation layer may be formed having a plurality of bonding pad openings. The bonding pad openings may be defined by a plurality of slits and may respectively expose the bonding pads. The slits may overlap isolations of the bonding pads and an edge width of the slits may be larger than a center width of the slits.

According to example embodiments, a semiconductor device may include a substrate that may support a plurality of bonding pads. A passivation layer may be provided on the substrate. The passivation layer may have a plurality of bonding pad openings respectively exposing the bonding pads. The bonding pad openings may be defined by a plurality of slits. An edge width of the slits may be larger than a center width of the slits. The pitch of the bonding pad openings may be 60 μm or less. A ratio between (1) the pitch of the bonding pad openings and (2) a minimum isolation distance between adjacent bonding pad openings may be greater than 2.5.

BRIEF DESCRIPTION OF THE DRAWINGS

Features of example embodiments will be discussed with reference to the attached drawings.

FIG. 2A is taken along the line 2A-2A in FIG. 4, and FIG. 2B is taken along the line 2B-2B in FIG. 4.

DESCRIPTION OF EXAMPLE NON-LIMITING EMBODIMENTS

Figure 1:
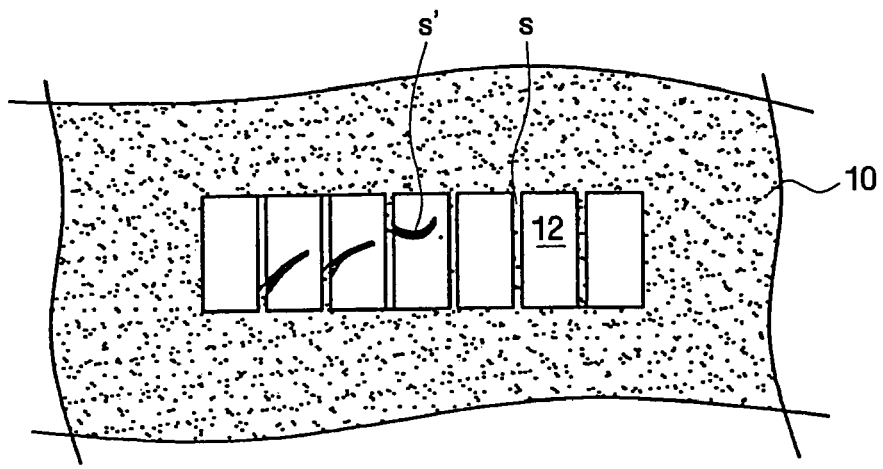
FIG. 1 is a diagram of a photosensitive polyimide pattern slit lifting phenomenon that may occur in conventional semiconductor devices.

Example embodiments will be readily appreciated by reference to the following detailed description in conjunction with the accompanying drawings. Example embodiments may, however, be embodied in many different forms and should not be construed as being limited to example embodiments set forth herein. Rather, example embodiments are provided so that this disclosure will be thorough and complete and will fully convey the concepts and teachings herein to those skilled in the art.

Well-known processes may not be described in detail to avoid unnecessarily obscuring the description of example embodiments.

The use of the terms "a" and "an" and "the" and similar referents in the context of describing example embodiment (and in the context of the following claims) are to be construed to cover both the singular and the plural, unless otherwise indicated herein. The terms "comprising" and "comprises" are to be construed as open-ended terms (i.e., meaning "including, but not limited to,") to indicate any and all possible combinations of one or more of the associated components, steps, operations, and/or devices unless otherwise noted. It will be understood that the term "and/or" as used herein refers to and encompasses any and all possible combinations of one or more of the associated listed items. In the drawings, like reference numerals denote like members.

In addition, example embodiments will be described with reference to perspective views, cross-sectional views, and/or plan views. The profile of an example embodiment may be modified according to manufacturing techniques and/or allowances. That is, example embodiments may cover all changes and modifications that may be caused due to a change in manufacturing process. For example, while an etched region may be shown in a rectangular shape, it may be rounded or have a predetermined curvature. Thus, regions shown in the drawings are illustrated in schematic form and the shapes of the regions are presented simply by way of illustration and not as a limitation. In the drawings, the thickness of layers and/or regions may be exaggerated or reduced for clarity.

Figures 2A, 2B:
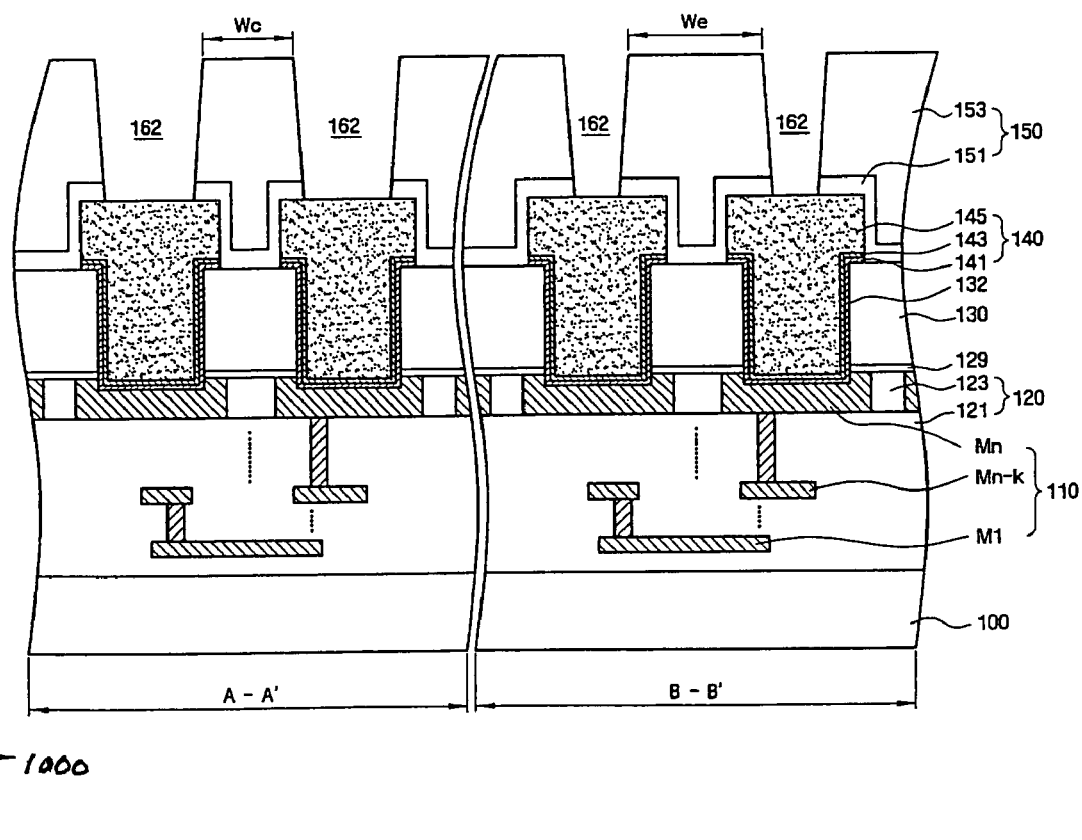
FIGS. 2A and 2B are cross-sectional views of a semiconductor device according to an example embodiment.

A semiconductor device according to an example embodiment will be described with reference to FIGS. 2 through 4. FIG. 2A is a cross-sectional view (taken along the line 2A-2A in FIG. 4) of a semiconductor device according to an example embodiment, FIG. 2B is a cross-sectional view (taken along the line 2B-2B in FIG. 4) of a semiconductor device according to an example embodiment, FIG. 3 is a perspective view of the semiconductor device illustrated in FIG. 2, and FIG. 4 is a plan view of the semiconductor device illustrated in FIG. 2.

Figure 3:
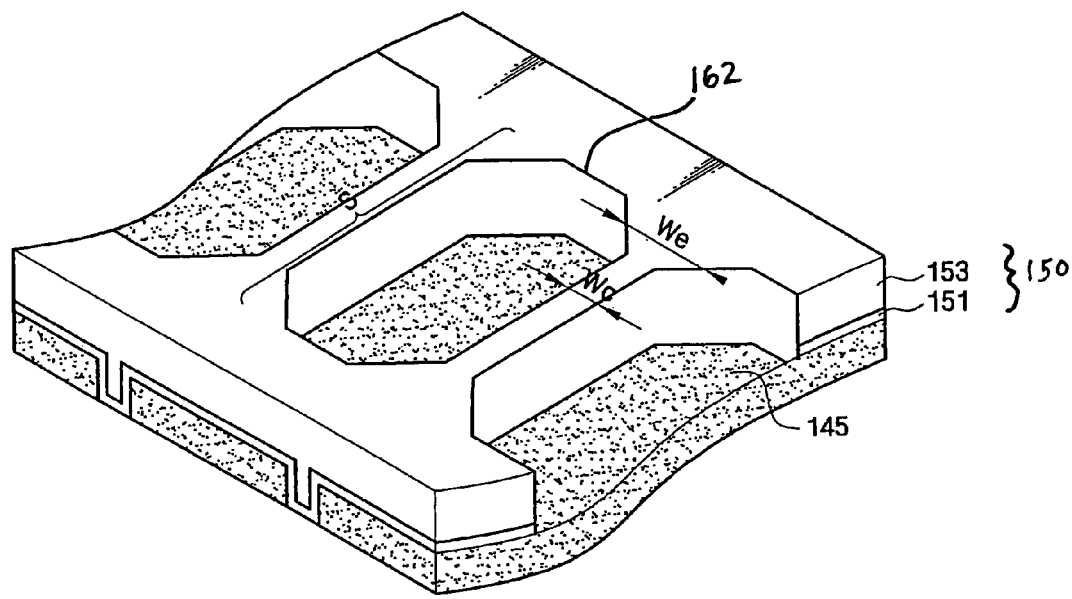
FIG. 3 is a perspective view of the semiconductor device illustrated in FIG. 2.
Figure 4:
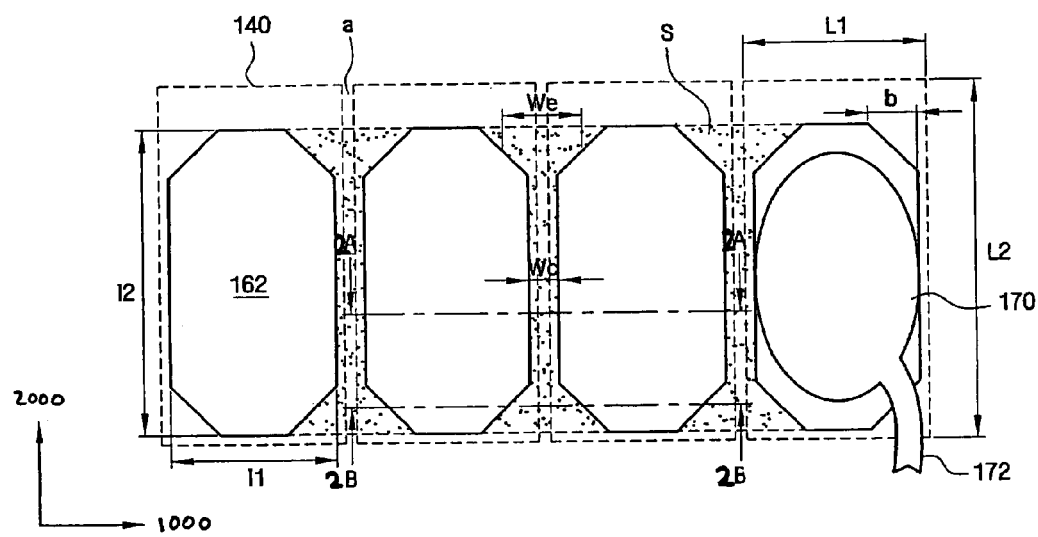
FIG. 4 is a plan view of the semiconductor device illustrated in FIG. 2.

Referring to FIGS. 2 through 4, the semiconductor device may include a dielectric layer 120 which may be formed on a semiconductor substrate 100 and in which a multi-layered interconnection structure 110 may be embedded. A plurality of bonding pads 140 may be connected to an uppermost interconnection layer Mn of the multi-layered interconnection structure 110. An upper passivation layer 150 may be provided, which may include a plurality of bonding pad openings 162 that may respectively expose the boding pads 140.

By way of example only, the semiconductor substrate 100 may be fabricated from at least one material selected from the group including Si, Ge, Si—Ge, Ga—P, Ga—As, SiC, SOI (silicon on insulator), and the like.

An integrated circuit device comprising active devices (not shown) such as transistors (for example) and/or passive devices (not shown) such as capacitors, resistors, and inductors (for example) may be formed on the substrate 100. The multi-layered interconnection structure 110 may be coupled to the integrated circuit device so that signals may be input/output to/from the integrated circuit device. The integrated circuit device may be embedded in the dielectric layer 120. Referring to FIG. 2, reference characters M1 through Mn (where n is an integer larger than k) respectively designate a plurality of interconnection layers of the multi-layered interconnection structure 110. For example, the interconnection layer Mn may be the uppermost interconnection layer. Reference numeral 123 designates an uppermost interlayer dielectric layer of the dielectric layer 120, and reference numeral 121 designates one or more other interlayer dielectric layers of the dielectric layer 120. The top surface of the uppermost interconnection layer Mn may be level with the top surface of the uppermost interlayer dielectric layer 123. In alternative embodiments, the uppermost interconnection layer Mn may be formed on top of the uppermost interlayer dielectric layer 123 through patterning (for example).

A lower passivation layer 130 may be formed on the dielectric layer 120. The lower passivation layer 130 may include a plurality of openings 132 in which the bonding pads 140 may be respectively formed. The openings 132 may expose the uppermost interconnection layer Mn.

By way of example only, the lower passivation layer 130 may protect the underlying elements, including the multi-layered interconnection structure 100, from an external environment, e.g., moisture and/or pressure. The lower passivation layer 130 may cover the uppermost interconnection layer Mn of the multi-layered interconnection structure 110.

By way of example only, the lower passivation layer 130 may be a silicon oxide layer, a silicon nitride layer, a silicon oxynitride layer, a PSG layer or a polyimide layer, or a stack of these layers. In alternative embodiments, the lower passivation layer 130 may be fabricated from other materials that are well known in this art.

An etch stop layer 129 may be interposed between the lower passivation layer 130 and the uppermost interlayer dielectric layer 123. The etch stop layer 129 may perform an etch stop function during the formation of the openings 132.

The bonding pads 140 may be formed on the lower passivation layer 130 and fill the respective openings 132. The bonding pads 140 may be areas where wire bonding may be performed. Referring to FIGS. 3 and 4, the bonding pads 140 may be arranged at a pitch in a first direction 1000 of about 60 µm or less. Each of the bonding pads 140 may include a diffusion barrier layer and a conductive layer 145. By way of example only, the diffusion barrier layer may include a titanium layer 141 and a titanium nitride layer 143, and the conductive layer 145 may be an aluminum layer.

By way of example only, the bonding pads 140 may have a rectangular shape that extends longer in a second direction 2000 than in the first direction 1000. For example, a length L2 of the bonding pad 140 in the second direction 2000 may be longer than a length L1 of the bonding pad 140 in the first direction 1000. Increasing the integration density may considerably affect the dimensions of the elements in the first direction 1000. Even if the bonding pad 140 has a shorter length L1 due to increasing an integration density(for example), a sufficient wire bonding area may be provided by virtue of the longer length L2 of the bonding pad 140 in the second direction 2000. The upper passivation layer 150 may include the bonding pad openings 162 that may expose the respective bonding pads 140. The bonding pad openings 162 may be arranged at substantially the same pitch as the bonding pads 140. For example, the bonding pad openings 162 may be arranged at a pitch in the first direction of about 60 µm or less. Here, a minimum isolation distance Wc between a pair of adjacent bonding pad openings 162 may be less than 24 µm. By way of example only, the bonding pad openings 162 may be arranged a pitch of less than 35 pm, and the minimum isolation distance Wc between a pair of adjacent bonding pad openings 162 may be less than 8 µm. According to example embodiments, the pitch of the bonding pad openings 162 may be 60 µm or less, and a ratio between (1) the pitch of the bonding pad openings 162 and (2) the minimum isolation distance Wc may be greater than 2.5:1. In alternative embodiment, the ratio may be greater than 3:1. In alternative embodiments, the ratio may be about 4.3:1.

The bonding pad openings 162 may be defined by a plurality of slits "S," which may respectively overlap a plurality of isolations "a" of the bonding pads 140. An edge width We of the slits "S" may be larger than a center width Wc of the slits "S." In this way, the proportion of narrow portions of the slits "S" (where a lifting phenomenon may more easily occur) may be reduced. Also, the narrow portions of the slits "S" may be held (and supported) by the wide portions of the slits "S," which may reduce the occurrence of the lifting phenomenon.

By way of example only, the bonding pad openings 162 may have an octagonal shape by chamfering and/or rounding the corners of the bonding pad openings 162. In alternative embodiments, the bonding pad openings 162 may have numerous and varied geometric shapes that may be defined by slits "S" having edge widths We that are thicker than the center widths Wc thereof. If the bonding pads 140 are rectangular, a length "b" by which the corners of the bonding pads 140 are chamfered or rounded may be less than 30% of the length L1 of the bonding pads 140 in the first direction 1000. In this manner, it may be possible to reduce the lifting phenomenon, provide a bonding region having substantially the same shape as a bonding portion 170 of a wire 172, and maintain the area of the bonding region where the bonding portion 170 is located within a predetermined margin range. The bonding pad openings 162 may extend longer in the second direction 2000 than in the first direction 1000 and thus a length l2 of the bonding pad openings 162 in the second direction 2000 may be longer than a length l1 of the bonding pad openings 162 in the first direction 1000.

The upper passivation layer 150 may include an upper polyimide layer 153 (for example) and at least one lower layer 151. By way of example only, the lower layer 151 may be a silicon oxide layer, a silicon nitride layer, a silicon oxynitride layer, a PSG layer, or a combination thereof. The polyimide layer 153 may (for example) protect elements of the semiconductor device from various chemicals, alpha particles, radioactive rays, high temperatures, and/or frictions. The polyimide layer 153 may be formed of non-photosensitive polyimide or photosensitive polyimide. Photosensitive polyimide may be implemented to form fine patterns. The lower layer 151 may be formed to strengthen the effect of protection by the polyimide layer 153 against an external environment. The lower layer 151 may be omitted.

A method of fabricating the semiconductor device illustrated in FIGS. 2 through 4 will be described with reference to FIGS. 5A through 5F.

Figure 5A:
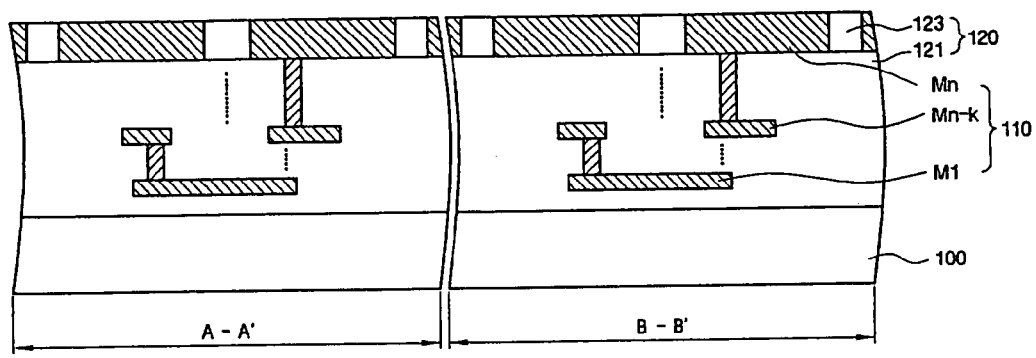
FIGS. 5A through 5F are cross-sectional views of a method that may be implemented to fabricate a semiconductor device according to an example embodiment.
Figure 5A:
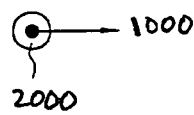

Referring to FIG. 5A, a dielectric layer 120, in which a multi-layered interconnection structure 110 may be embedded, may be formed on a semiconductor substrate 100.

An integrated circuit device that may include (for example) active devices (not shown) such as transistors and passive devices (not shown) such as capacitors, resistors, and inductors may be formed on the semiconductor substrate 100. The multi-layered interconnection structure 100 may be coupled to the integrated circuit device so that signals may be input/output to/from the integrated circuit device. Referring to FIGS. 5A through 5F, reference characters M1 through Mn (where n is an integer larger than k) respectively indicate a plurality of interconnection layers of the multi-layered interconnection structure 110. For example, reference character Mn may indicate an uppermost interconnection layer of the multi-layered interconnection structure 110.

Figure 5B:
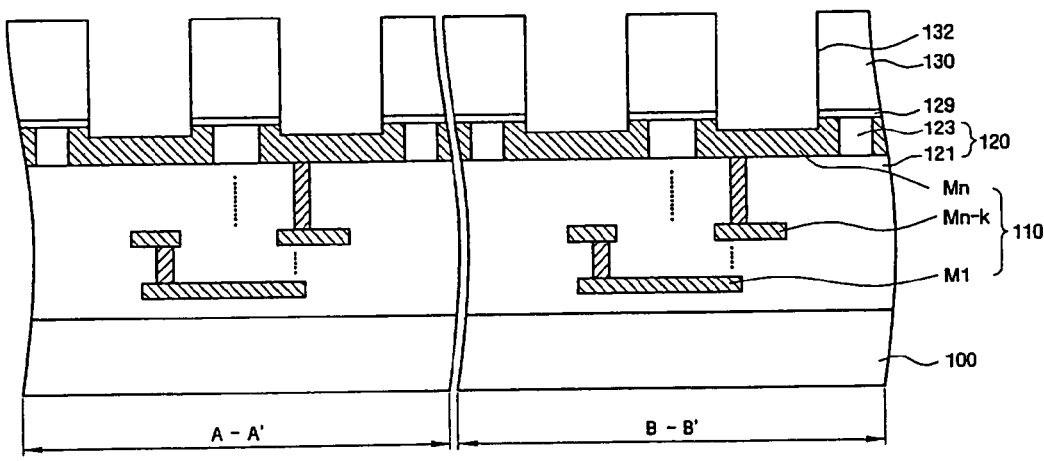
Figure 5B:
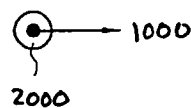

Referring to FIG. 5B, a lower passivation layer 130 including a plurality of openings 132 maybe formed.

For example, an etch stop layer 129 and the lower passivation layer 130 may be sequentially formed on the dielectric layer 120 in which the multi-layered interconnection structure 110 is embedded.

The lower passivation layer 130, which may protect the underlying integrated circuit device and the multi-layered interconnection structure 110 from an external environment such as moisture and/or pressure (for example), may cover the uppermost interconnection layer Mn.

By way of example only, the lower passivation layer 130 may include a silicon oxide layer, a silicon nitride layer, a silicon oxynitride layer, a PSG layer, a polyimide layer, or a stack of these layers. Example embodiments are not limited in this regard. The lower passivation layer 130 may be formed using a method, such as a chemical vapor deposition (CVD) method, a plasma enhanced CVD (PECVD) method, a physical vapor deposition (PVD) method, and/or a spin coating method, for example.

A plurality of openings may be formed by patterning the lower passivation layer 130 so that the etch stop layer 129 may exposed. The etch stop layer 129 that is exposed through the openings may be removed, thereby completing the openings 132.

Figure 5C:
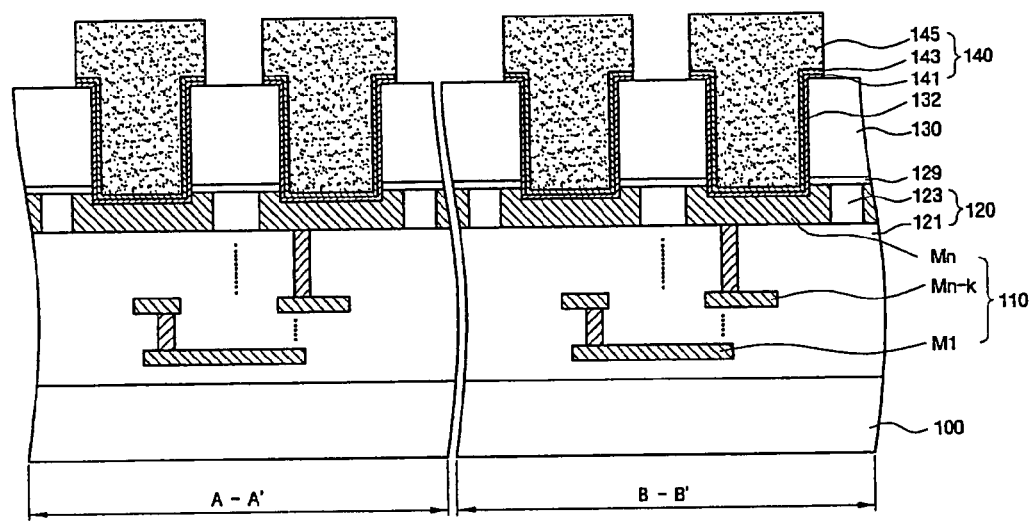
Figure 5C:
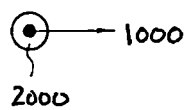

Referring to FIG. 5C, a diffusion barrier layer (e.g., a titanium layer 141 and a titanium nitride layer 143) and a conductive layer 145 (e.g., an aluminum layer) may be sequentially formed on the entire surface of the lower passivation layer 130 including the openings 132. The diffusion barrier layer (141 and 143) and the conductive layer 145 may be sequentially patterned, thereby forming the bonding pads 140 that respectively fill the openings 132. The diffusion barrier layer (141 and 143) may prevent diffusion of the conductive layer 145.

The bonding pads 140 may be areas where wire bonding may be performed. The bonding pads 140 may be arranged at pitch in the first direction 1000 of about 60 μm or less. The bonding pads 140 may have a rectangular shape that extends longer in the second direction 2000 than in the first direction 1000.

Figure 5D:
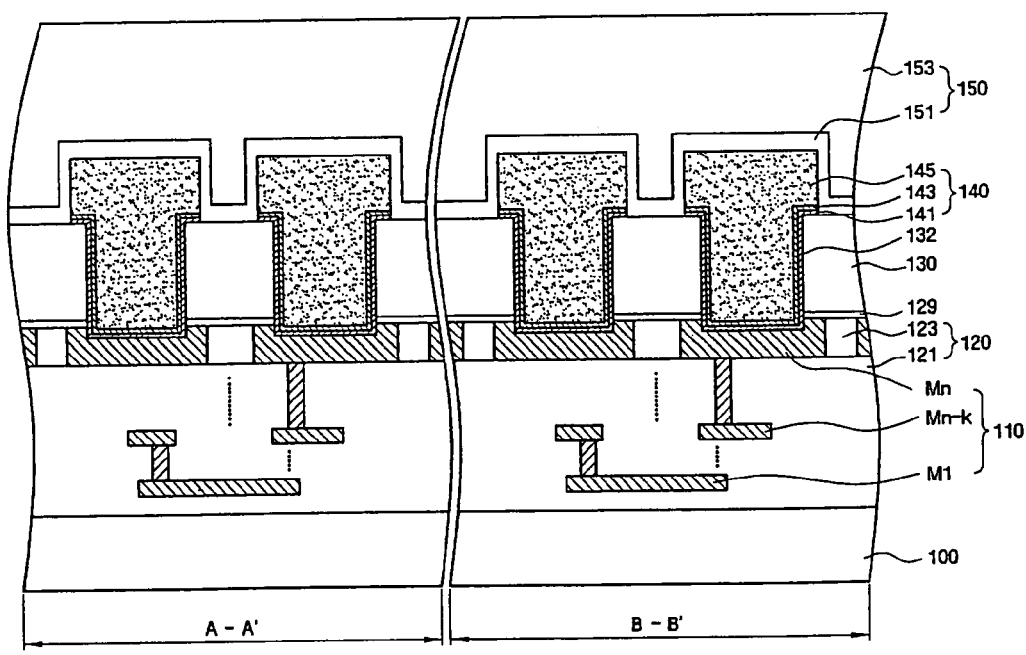
Figure 5D:
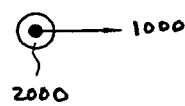

Referring to FIG. 5D, an upper passivation layer 150 that covers the bonding pads 140 may be formed.

The upper passivation layer 150 may be formed by depositing at least one lower layer 151, which may be (for example) a silicon oxide layer, a silicon nitride layer, a silicon oxynitride layer, a PSG layer, or a combination thereof, and a polyimide layer 153. The polyimide layer 153 may be formed using a method that is well known to one of ordinary skill in the art. For example, the polyimide layer 153 may be formed using a spin coating method that involves the use of a spin coater. The thickness of the polyimide layer 153 may be determined in consideration that the polyimide layer 153 may become thinner after a hardening process.

The polyimide layer 153 may protect the underlying elements from various chemicals, alpha particles, radioactive rays, high temperatures, and/or frictions, for example. Also, the polyimide layer 153 may prevent cracks from spreading due to a difference between a thermal expansion coefficient of the dielectric layer 120 and a thermal expansion coefficient of an epoxy compound molding that is to be formed in a packaging process. The lower layer 151 may strengthen the effect of protection offered by the polyimide layer 153. The lower layer 151 may be omitted.

Figure 5E:
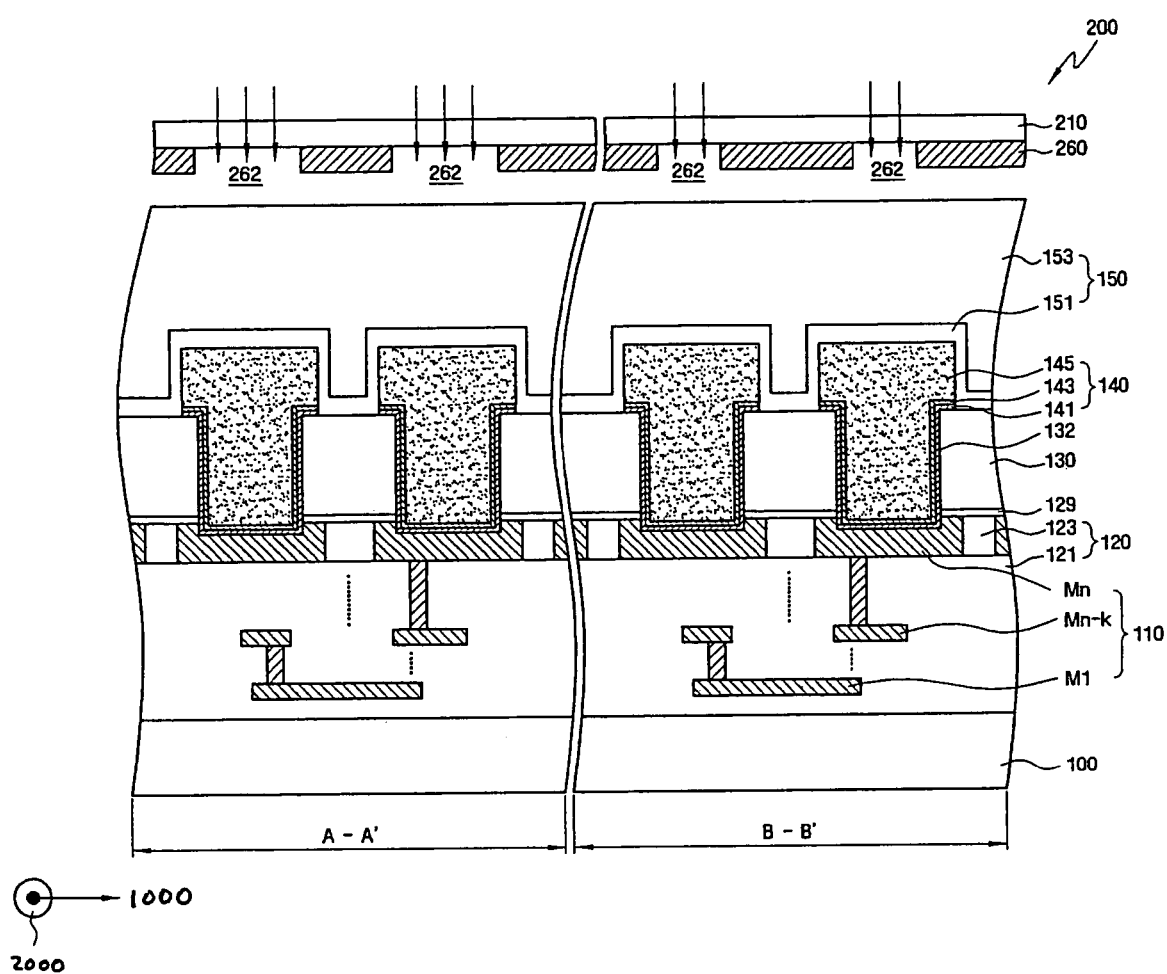

Referring to FIG. 5E, light exposure may be performed on the upper passivation layer 150.

FIG. 5E illustrates a polyimide layer 153 that may be formed of positive photosensitive polyimide. In this case, exposure may be readily performed on the upper passivation layer 150 without the need to form a photoresist pattern.

For example, exposure may be performed on the polyimide layer 153 using a reticle 200. The reticle 200 may include a transparent substrate 210 through which exposure light transmits, and a light shield layer 260 may be provided on the transparent substrate 210. The light shield layer 260 may include a plurality of polygonal light transmitters 262 that may be spaced apart in the first direction 1000. The corners of the polygonal light transmitters 260 may be chamfered or rounded so that the polygonal light transmitters 260 may have an octagonal shape. Exposure may be performed on the polyimide layer 153 using the reticle 200. Exposed portions of the polyimide layer 153 may be dissolved by a developer.

Figure 5F:
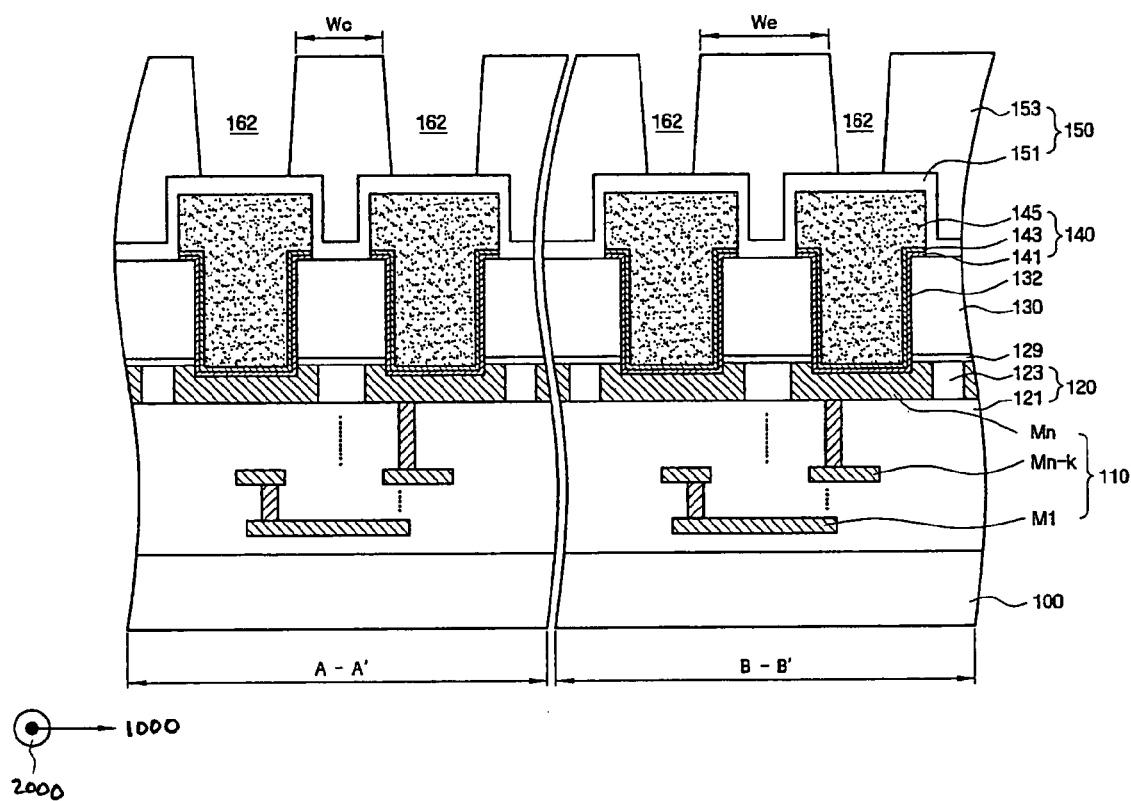

Referring to FIG. 5F, the polyimide layer 153 may be treated using a developer so that the exposed portions of the polyimide layer 153 may be removed. As a result, polyimide patterns 153 may be formed. The lower layer 151 may be etched using the polyimide patterns 153 as etch masks, thereby forming bonding pad openings 162. The polyimide patterns 153 may be used as etch masks after being hardened. When a photosensitive polyimide layer is used as the polyimide layer 153, there may be no need to form photoresist patterns, and thus, the manufacture of a semiconductor device may be simplified.

In alternative embodiments, a non-photosensitive polyimide layer may be used as the polyimide layer 153. When a non-photosensitive polyimide layer is used as the polyimide layer 153, photoresist patterns (not shown) may be formed on the polyimide layer 153, and the polyimide layer 153 and the lower layer 151 may be sequentially etched using the photoresist patterns as etch masks, thereby forming the bonding pad openings 162. Before the formation of the photoresist patterns, a hardening process for hardening the polyimide layer 153 may be performed.

As described above with reference to FIG. 2 through 4, the bonding pad openings 162 may be defined by a plurality of slits "S," which may respectively overlap a plurality of isolations "a" of the bonding pads 140. An edge width We of the slits "S" may be larger than a center width Wc of the slits "S," thereby reducing the proportion of narrow portions Wc of the slits "S" where a lifting phenomenon may occur. Also, the narrow portions Wc of the slits "S" may be held (and supported) by the wide portions We of the slits "S," thereby reducing the occurrence of the lifting phenomenon.

According to example embodiments, it may be possible to improve the reliability of wire bonding by reducing the probability of passivation layer slits that define pad openings being lifted from the device.

According to example embodiments, it may be possible to prevent passivation layer slits from being lifted from the device, provide a bonding region having almost the same shape as the shape of a wire bonding portion, and/or maintain the area of the bonding region within a predetermined margin range.

Those skilled in the art will appreciate that many variations and modifications can be made to example embodiments without substantially departing from the principles and teachings herein. Therefore, example embodiments are used in a generic and descriptive sense only and not for purposes of limitation.

What is claimed is:

1. A semiconductor device, comprising:
   a substrate;
   a dielectric layer provided on the substrate;
   a multi-layered interconnection structure embedded in the dielectric layer;
   a plurality of bonding pads connected to an uppermost interconnection layer of the multi-layered interconnection structure, wherein the bonding pads are spaced apart in a first direction by isolations between adjacent bonding pads; and
   a passivation layer having a plurality of bonding pad openings, wherein the bonding pad openings are defined by a plurality of slits, and wherein the bonding pad openings expose the bonding pads;
   wherein the slits overlap the isolations of the bonding pads,
   wherein an edge width of the slits is larger than a center width of the slits, and
   wherein a width of the bonding pad openings in the first direction is greater than a width of the slits in the first direction,
   wherein the bonding pads are rectangular,
   wherein the bonding pad openings are rectangles with chamfered or rounded corners,
   wherein a length by which the corners of the bonding pad openings are chamfered or rounded is less than about 30% of a length of the bonding pads in the first direction,
   wherein the bonding pad openings are arranged at a pitch of less than about 60 μm, and
   wherein a minimum isolation distance between a pair of adjacent bonding pad openings is less than about 24 μm.

2. The semiconductor device of claim 1, wherein the passivation layer comprises an upper polyimide layer and a lower layer, and
   wherein the lower layer is at least one of a silicon oxide layer, a silicon nitride layer, a silicon oxynitride layer, and a phosphor silicate glass (PSG) layer.

3. The semiconductor device of claim 2, wherein the polyimide layer comprises a photosensitive polyimide layer.

4. The semiconductor device of claim 1, further comprising:
   a lower passivation layer interposed between the passivation layer and the dielectric layer;
   wherein the lower passivation layer includes a plurality of openings that expose the uppermost interconnection layer, and
   wherein the bonding pads respectively fill the openings.

5. A reticle for forming a bonding pad pattern on a dielectric layer, the reticle formed on a substrate through which exposure light is transmittable, comprising:
   a light shield layer with a plurality of light transmitters;
   wherein the plurality of light transmitters are spaced apart in a first direction by isolations between adjacent light transmitters,
   wherein the plurality of light transmitters are rectangular,
   wherein the plurality of light transmitters are rectangles with chamfered or rounded corners,
   wherein a pitch of the light transmitters is 60 μm or less, and
   wherein a minimum isolation distance between a pair of adjacent light transmitters is less than about 24 μm.

6. A method of fabricating a semiconductor device, the method comprising:
   providing a substrate;
   forming a dielectric layer on the substrate, wherein a multi-layered interconnection structure is embedded in the dielectric layer;
   forming a plurality of bonding pads connected to an uppermost interconnection layer of the multi-layered interconnection structure, wherein the bonding pads are spaced apart in a first direction by isolations between adjacent bonding pads; and
   forming a passivation layer having a plurality of bonding pad openings, wherein the bonding pad openings are defined by a plurality of slits, and wherein the bonding pad openings expose the bonding pads;
   wherein the slits overlap the isolations of the bonding pads,
   wherein an edge width of the slits is larger than a center width of the slits,
   wherein a width of the bonding pad openings in the first direction is greater than a width of the slits in the first direction,
   wherein the bonding pads are rectangular,
   wherein the bonding pad openings are rectangles with chamfered or rounded corners, wherein a length by which the corners of the bonding pad openings are chamfered or rounded is less than about 30% of a length of the bonding pads in the first direction, wherein the bonding pad openings are arranged at a pitch of less than about 60 μm, and wherein a minimum isolation distance between a pair of adjacent bonding pad openings is less than about 24 μm.

7. The method of claim 6, wherein the bonding pads are rectangular, wherein the bonding pad openings are rectangles with chamfered or rounded corners, and wherein a length by which the corners of the bonding pad openings are chamfered or rounded is less than about 30% of a length of the bonding pads in the first direction.

8. The method of claim 6, wherein the bonding pad openings are arranged at a pitch of less than 60 μm.

9. The method of claim 8, wherein a minimum isolation distance between a pair of adjacent bonding pad openings is less than about 24 μm.

10. The method of claim 6, wherein forming the passivation layer comprises:

forming an upper polyimide layer and a lower layer; and forming a plurality of passivation layer patterns by patterning the upper polyimide layer and the lower layer so that the bonding pad openings are defined;

wherein the lower layer is at least one of a silicon oxide layer, a silicon nitride layer, a silicon oxynitride layer, and a phosphor silicate glass (PSG) layer.

11. The method of claim 10, wherein the upper polyimide layer comprises a photosensitive polyimide layer, and wherein patterning the upper polyimide layer and the lower layer comprises:

forming a plurality of photosensitive polyimide layer patterns by performing exposure and development on the photosensitive polyimide layer; and etching the lower layer using the photosensitive polyimide layer patterns as etch masks.

12. The method of claim 6, wherein forming the plurality of bonding pads comprises:

forming a lower passivation layer on the dielectric layer;

forming a plurality of openings by patterning the lower passivation layer to expose the uppermost interconnection layer;

forming a conductive layer filling the openings; and forming the bonding pads by patterning the conductive layer.

13. A semiconductor device, comprising:

a substrate supporting a plurality of bonding pads spaced apart in a first direction by isolations between adjacent bonding pads; and a passivation layer provided on the substrate, wherein the passivation layer has a plurality of bonding pad openings exposing the bonding pads;

wherein the bonding pad openings are defined by a plurality of slits, wherein an edge width of the slits is greater than a center width of the slits, wherein a pitch of the bonding pad openings is 60 μm or less, wherein a ratio of the pitch of the bonding pad openings to a minimum isolation distance between adjacent bonding pad openings is greater than 2.5:1, and wherein a width of the bonding pad openings in the first direction is greater than a width of the slits in the first direction.

14. The semiconductor device of claim 13, wherein a minimum isolation distance between a pair of adjacent bonding pad openings is less than about 24 μm.

15. The semiconductor device of claim 1, wherein a ratio of the pitch of the bonding pad openings to a minimum isolation distance between a pair of adjacent bonding pad openings is greater than 2.5:1.

16. The reticle of claim 5, wherein the pitch of the light transmitters is less than 35 μm.

17. The method of claim 6, wherein a ratio of a pitch of the bonding pad openings to a minimum isolation distance between a pair of adjacent bonding pad openings is greater than 2.5:1.

18. The semiconductor device of claim 13, wherein the pitch of the bonding pad openings is less than 35 μm.

* * * * *